United States Patent
Tang et al.

(10) Patent No.: US 9,716,230 B2
(45) Date of Patent: *Jul. 25, 2017

(54) LIGHT EMITTING DEVICE, PRODUCTION METHOD THEREOF, AND DISPLAY PANEL

(71) Applicant: BOE TECHNOLOGY GROUP CO., LTD., Beijing (CN)

(72) Inventors: Chen Tang, Beijing (CN); Jingxia Gu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

This patent is subject to a terminal disclaimer.

(21) Appl. No.: 14/436,949

(22) PCT Filed: Apr. 24, 2014

(86) PCT No.: PCT/CN2014/076133
§ 371 (c)(1),
(2) Date: Apr. 20, 2015

(87) PCT Pub. No.: WO2015/109677
PCT Pub. Date: Jul. 30, 2015

(65) Prior Publication Data
US 2015/0380654 A1    Dec. 31, 2015

(30) Foreign Application Priority Data
Jan. 27, 2014 (CN) .......................... 2014 1 0040018

(51) Int. Cl.
*H01L 51/54* (2006.01)
*H01L 27/32* (2006.01)
(Continued)

(52) U.S. Cl.
CPC .......... *H01L 51/0039* (2013.01); *C09K 11/06* (2013.01); *C09K 11/08* (2013.01);
(Continued)

(58) Field of Classification Search
CPC ....... H01L 33/02–33/346; H01L 51/00–51/56; H01L 2227/323;
(Continued)

(56) References Cited

U.S. PATENT DOCUMENTS 5,998,045 A * 12/1999 Chen ...................... C09K 11/06
                                                              313/504
2008/0278063 A1* 11/2008 Cok ........................ B82Y 20/00
                                                              313/500
(Continued)

FOREIGN PATENT DOCUMENTS

CN      1595670 A      3/2005
CN      101197428 A    6/2008
(Continued)

OTHER PUBLICATIONS

"White emission from polymer/quantum dot ternary nanocomposites by incomplete energy transfer" by Jong Hyeok Park et al., Nanotechnology 15 (2004) 1217-1220.*
(Continued)

*Primary Examiner* — Eric Ward
(74) *Attorney, Agent, or Firm* — Kinney & Lange, P.A.

(57) ABSTRACT

The present disclosure provides a light emitting device, a production method thereof, and a display panel, for simplifying the production process of light emitting device and improving the performance of the light emitting device. The light emitting device in the present disclosure comprises a white light emitting layer comprising a polyfluorene blue light material, and red light quantum dots and green light quantum dots doped in the polyfluorene blue light material.

19 Claims, 2 Drawing Sheets

(51) Int. Cl.
*H01L 51/00* (2006.01)
*H01L 51/50* (2006.01)
*C09K 11/06* (2006.01)
*C09K 11/08* (2006.01)
*C09K 11/88* (2006.01)
*H01L 51/56* (2006.01)

(52) U.S. Cl.
CPC .......... *C09K 11/881* (2013.01); *H01L 27/322* (2013.01); *H01L 51/0043* (2013.01); *H01L 51/502* (2013.01); *H01L 51/5036* (2013.01); *H01L 51/56* (2013.01); *C09K 2211/14* (2013.01); *C09K 2211/1416* (2013.01); *H01L 2227/323* (2013.01); *H01L 2251/301* (2013.01); *Y02B 20/181* (2013.01)

(58) Field of Classification Search
CPC ............ H01L 2251/301; H01L 27/322; C09K 11/06; C09K 11/08; C09K 11/881; C09K 2211/14; C09K 2211/1416; Y02B 20/181
USPC .......................................................... 977/774
See application file for complete search history.

(56) References Cited

U.S. PATENT DOCUMENTS

| | | | | |
|---|---|---|---|---|
| 2012/0267616 | A1* | 10/2012 | Jang ........................ | B82Y 20/00 257/40 |
| 2013/0146838 | A1* | 6/2013 | Ku .................. | H01L 31/035218 257/13 |
| 2014/0306179 | A1* | 10/2014 | Demir .................. | H01L 51/502 257/13 |
| 2015/0021551 | A1* | 1/2015 | Breen .................. | C09K 11/595 257/14 |
| 2015/0329774 | A1* | 11/2015 | Gu ........................ | C09K 11/06 252/301.33 |
| 2016/0005989 | A1* | 1/2016 | Gu ........................ | H01L 51/502 257/13 |

FOREIGN PATENT DOCUMENTS

| | | |
|---|---|---|
| CN | 101219921 A | 7/2008 |
| CN | 101255336 A | 9/2008 |
| CN | 101307856 A | 11/2008 |
| CN | 103323975 A | 9/2013 |
| CN | 103421513 A | 12/2013 |
| CN | 103500803 A | 1/2014 |
| CN | 103525406 A | 1/2014 |
| WO | 2005018011 A2 | 2/2005 |
| WO | 2013112298 A1 | 8/2013 |

OTHER PUBLICATIONS

"Three-Band White Light-Emitting Diodes Based on Hybridization of Polyfluorene and Colloidal CdSe—ZnS Quantum Dots" in IEEE Photonics Technology Letters, vol. 22, No. 5, Mar. 1, 2010 by Chun-Yuan Huang et al.*
"Hybrid White-Light Emitting-LED Based on Luminescent Polyfluorene Polymer and Quantum Dots" in Journal of Nanoscience and Nanotechnology, vol. 7, 2785-2789, 2007, by Cheng-Hsuan Chou et al.*
"Efficient hybrid white light-emitting diodes by organic-inorganic materials at different CCT from 3000K to 9000K" in Optics Express, vol. 23, Issue 7, p. A204 by Kuo-Ju Chen et al.*
"Highly Efficient White Light-Emitting Diodes Based on Quantum Dots and Polymer Interface" in IEEE Photonics Technology Letters, vol. 24, No. 18, Sep. 15, 2012, by Byoung-Ho Kang et al.*
"Excellent Color Quality of White-Light-Emitting Diodes by Embedding Quantum Dots in Polymers Material" IEEE Journal of Selected Topics in Quantum Electronics, vol. 22, No. 1, Jan./Feb. 2016 by Huang-Yu Lin et al.*
"CdSe/ZnS Nanoparticle Composites with Amine-Functionalized Polyfluorene Derivatives for Polymeric Light-Emitting Diodes: Synthesis, Photophysical Properties, and the Electroluminescent Performance" by Zeng-Shan Guo et al. in Macromolecules 2010, 43, 1860-1866.*
First Office Action for CN Application No. 201410040018.4, dated Aug. 6, 2015, 7 pages.
Search Report for CN Application No. 201410040018.4, dated Jul. 29, 2015, 3 pages.
Written Opinion of the International Searching Authority for corresponding PCT Application No. PCT/CN2014/076133, 3 pages.
International Search Report and Written Opinion in Chinese dated Sep. 22, 2014 for PCT Application No. PCT/CN2014/076133.
Second Chinese Office Action (and English translation) dated Dec. 8, 2015, for corresponding Chinese Application No. 201410040018. 4.
Chinese Office Action, for Chinese Patent Application No. 2014100400184, dated May 12, 2016, 10 pages.
Chinese Reexamination Notification, for Chinese Patent Application No. 201410040018.4, dated Nov. 7, 2016, 11 pages.
Chinese Reexamination Decision, for Chinese Patent Application No. 201410040018.4, dated Mar. 30, 2017, 16 pages.

* cited by examiner

LIGHT EMITTING DEVICE, PRODUCTION METHOD THEREOF, AND DISPLAY PANEL

FIELD

The present disclosure relates to the technical field of display, especially relates to a light emitting device, a production method thereof, and a display panel.

BACKGROUND

Quantum dots are quasi-zero dimensional nanosemiconductor materials. They are formed of a small number of atoms or atom groups, with an ordinary three-dimension scale of from 1 to 10 nanometers. Quantum dots have special photoluminescence and electroluminescence performances, and advantages such as low power consuming, high efficiency, fast response speed, light weight and the like. They have relatively high academic value and good commercial prospect.

Utilizing luminescence characteristic of quantum dots, they can be applied in organic light emitting devices. Currently, in light emitting devices, quantum dots are generally used for obtaining white light, which is achieved by a multi-layer structure, that is, red light quantum dots, green light quantum dots, and blue light quantum dots are used for forming a red light emitting layer, a green light emitting layer, and a blue light emitting layer, respectively, and the three types of light emitting layers are stacked in form of laminate, to obtain white light.

The above manner of obtaining white light by using a multi-layer structure needs to produce three light emitting layers with different colors, respectively, and stack the three light emitting layers into a laminate.

SUMMARY

In some embodiments of the present disclosure, a light emitting device and a production method thereof are provided, to simplify the production process of the light emitting device and to improve the performance of the light emitting device.

In some embodiments of the present disclosure, a light emitting device is provided, the light emitting device comprising a white light emitting layer, wherein, the white light emitting layer comprises a polyfluorene blue light material, and red light quantum dots and green light quantum dots doped in the polyfluorene blue light material.

In the light emitting devices of some embodiments of the present disclosure, the white light emitting layer comprises a polyfluorene blue light material, the polyfluorene blue light material having a relatively high thermal stability and chemical stability, and having a relatively high fluorescent quantum yield and a relatively high luminous efficiency, and the white light emitting layer has red light quantum dots and green light quantum dots doped into the polyfluorene blue light material. The white light emitting layer is a single film layer structure, which can be formed into a film in one time, without preparing the red light emitting layer, the green light emitting layer, and the blue light emitting layer, respectively. Therefore, the process is simple, the structure is simple, and it is easy to be scaled up.

In some embodiments of the present disclosure, the doping ratio between the red light quantum dots and the green light quantum dots is from 0.5:1 to 0.8:1, and the doping ratio between the green light quantum dots and the polyfluorene blue light material is from 1:1.1 to 1:1.4, to control the color gamut of the white light in an acceptable range.

In one embodiment, the doping ratio between the red light quantum dots and the green light quantum dots is from 0.6:1 to 0.7:1, and the doping ratio between the green light quantum dots and the polyfluorene blue light material is from 1:1.2 to 1:1.3, to improve the color gamut of the white light.

In one embodiment, the doping ratio of the red light quantum dots, the green light quantum dots and the polyfluorene blue light material is (0.5-0.8):1:(1.1-1.4), to control the color gamut of the white light in an acceptable range.

In one embodiment, the doping ratio of the red light quantum dots, the green light quantum dots and the polyfluorene blue light material is (0.6-0.7):1:(1.2-1.3), to improve the color gamut of the white light.

In some embodiments of the present disclosure, the polyfluorene blue light material is one or more selected from the group consisting of poly(9,9-dialkyl fluorene), a copolymer of dihexylfluorene and anthracene, biphenyl containing branched side chains, a tetraalkyl substituted indenofluorene polymer, a polyfluorene bithiophene alternative copolymer, an alternative copolymer of octyl-bisubstituted fluorene and benzothiadiazde, a binary or ternary random copolymer of fluorene and thiophene, ethylenedioxythiophene, 4.7-dithiophene-2,1,3-benz othiadiazde or 4.7-dithiophene-2,1,3-benzoselenadiazole.

In some embodiments of the present disclosure, the red light quantum dots are Group II-VI element compounds and the like.

In some embodiments of the present disclosure, the red light quantum dots are compound semiconductor materials formed of Group II element Zn, Cd, or Hg, and Group VI element S, Se, or Te, and the like.

In some embodiments of the present disclosure, the red light quantum dots are ZnS, ZnSe, ZnTe, CdS, CdSe, CdTe, HgS, HgSe, HgTe, or the like.

In some embodiments of the present disclosure, the green light quantum dots are Group III-V element compounds.

In some embodiments of the present disclosure, the green light quantum dots are compounds formed of B, Al, Ga, or In of Group III, and N, P, As, or Sb of Group V.

In some embodiments of the present disclosure, the green light quantum dots are BN, BP, BAs, BSb, AlN, AlP, AlAs, AlSb, GaN, GaP, GaAs, GaSb, InAs, InN, InP, or InSb.

Another aspect of the present disclosure provides a display panel comprising:

a color film substrate and an array substrate, wherein the array substrate is provided with a plurality of pixel units, and each pixel unit has a plurality of subpixel units displaying different colors, the above described light emitting device provided on the array substrate at the position corresponding to each subpixel unit; and a color filter corresponding to each subpixel unit, wherein the color filter is positioned between the white light emitting layer of the light emitting device and the color film substrate.

In the display panel provided by examples of the present disclosure, the white light emitting layer of the light emitting device comprises a polyfluorene blue light material, which has high thermal stability and chemical stability, and has high fluorescent quantum yield and high luminous efficiency, while the polyfluorene blue light material in white light emitting layer is doped with red light quantum dots and green light quantum dots, and the white light emitting layer is a single film layer structure, which can be formed into a film in one time, without preparing the red light emitting layer, the green light emitting layer, and the blue light emitting layer, respectively. Therefore, the process is simple, the structure is simple, and it is easy to be scaled up.

A further aspect of the present disclosure provides a production method of light emitting device, comprising:

forming an anode and a hole injection layer in this order on a substrate;

forming a white light emitting layer on the hole injection layer, the white light emitting layer comprising a polyfluorene blue light material, and red light quantum dots and green light quantum dots doped into the polyfluorene blue light material;

forming an electron transferring layer and a cathode in this order on the white light emitting layer.

In the production method of light emitting device provided by some embodiments of the present disclosure, a white light emitting layer comprising a polyfluorene blue light material and red light quantum dots and blue light quantum dots doped in the polyfluorene blue light material is formed. Because the polyfluorene blue light material has high thermal stability and chemical stability, and a high fluorescent quantum yield, and in turn a high luminous efficiency, and the white light emitting layer is a single film layer structure, which can be formed into a film in one time, without preparing the red light emitting layer, the green light emitting layer, and the blue light emitting layer, respectively. Therefore, the process is simple, the structure is simple, and it is easy to be scaled up.

In some embodiments, the white light emitting layer is formed on the hole injection layer by:

dissolving a polyfluorene or a derivative thereof, together with red light quantum dots and green light quantum dots at a predetermined ratio into an organic solvent, to form a polyfluorene blue light material doped with red light quantum dots and green light quantum dots;

coating the polyfluorene blue light material doped with the red light quantum dots and the green light quantum dots onto the hole injection layer, to form the white light emitting layer.

In the above described production method, the desired color gamut of white light is adjustable by controlling the doping ratio of the polyfluorene or derivative thereof, the red light quantum dots, and the green light quantum dots.

In some embodiments, the step of dissolving the polyfluorene or derivative thereof, together with the red light quantum dots and the green light quantum dots at a predetermined ratio into an organic solvent, to form the polyfluorene blue light material doped with the red light quantum dots and the green light quantum dots, specifically comprises:

dissolving the red light quantum dots, the green light quantum dots and the polyfluorene or derivative thereof together at a doping ratio of (0.5-0.8):1:(1.1-1.4) into an organic solvent, forming the polyfluorene blue light material doped with the red light quantum dots and the green light quantum dots, to control the color gamut of white light in an effective range.

Further, dissolving the polyfluorene or derivative thereof, together with the red light quantum dots and the green light quantum dots at a predetermined ratio into an organic solvent, to form the polyfluorene blue light material doped with the red light quantum dots and the green light quantum dots, specifically comprises:

dissolving the red light quantum dots, the green light quantum dots and the polyfluorene or derivative thereof together at a doping ratio of (0.6-0.7):1:(1.2-1.3) into an organic solvent, forming the polyfluorene blue light material doped with the red light quantum dots and the green light quantum dots, to improve the color gamut of white light.

In some embodiments, the organic solvent comprises toluene, chlorobenzene, or trichloromethane, to improve the yield of the polyfluorene blue light material doped with the red light quantum dots and the green light quantum dots.

DETAILED DESCRIPTION

Technical solutions of examples of the present disclosure will be clearly and completely described below with reference to Figures of examples of the present disclosure. Obviously, the described examples are only a part of examples of the present disclosure, instead of all examples. On the basis of examples in the present disclosure, all other examples obtained by a person skilled in the art without paying inventive labors belong to the protection scope of the present disclosure.

Polyfluorene homopolymers have relatively large band gap, and are blue light emitting materials. Due to the rigid in-plane biphenyl units contained in the structure thereof, they have high thermal stability and chemical stability, a high fluorescence quantum yield in solid state, and a high luminous efficiency.

Some examples of the present disclosure provide a light emitting device of polyfluorene blue light emitting material doped with quantum dots, the light emitting device including a white light emitting layer 4 comprising a polyfluorene blue light material 401, and red light quantum dots 402 and green light quantum dots 403 doped into the polyfluorene blue light material 401.

Figure 1:
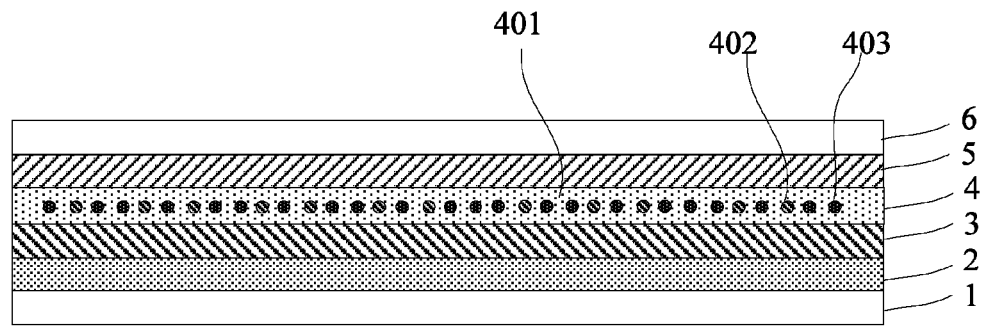
FIG. 1 is a schematic cross-section structure of the light emitting device provided by an example of the present invention.

FIG. 1 is a schematic cross-section structure of the light emitting device provided by an example of the present disclosure. As shown in FIG. 1, the light emitting device provided by an example of the present disclosure comprises a substrate 1, an anode 2, a hole injection layer 3, a white light emitting layer 4, an electron transferring layer 5, and a cathode 6.

Specifically, in examples of the present disclosure, the substrate 1 can be a substrate based on a transparent inorganic material such as a glass substrate, a quartz substrate, and the like, and can also be a substrate of transparent organic material. The production process of it is simple, and the technical barrier is low.

In examples of the present disclosure, the anode 2 formed on the substrate 1 is a transparent electrode, which can employ one or more materials selected from Indium Tin Oxide (ITO), Indium Zinc Oxide (IZO), Indium Gallium Zinc Oxide (IGZO) and the like, and not limited thereto. It may also be a transparent electrode made of other materials.

In examples of the present disclosure, the hole injection layer 3 is formed between the anode 2 and the white light emitting layer 4, and may employ a material such as PEDOT:PSS (poly3,4-ethylenedioxythiophene:polystyrene sulfonic acid).

In examples of the present disclosure, the white light emitting layer 4 is a single layer structure. The white light emitting layer 4 comprises a polyfluorene blue light material 401 with high luminous efficiency, and red light quantum dots 402 and green light quantum dots 403 doped in the polyfluorene blue light material 401.

Polyfluorene blue light material 401 is a polyfluorene or derivative thereof, comprising P17 poly(9,9-dialkyl fluorene) (PDAFs), P18 (copolymer of dihexylfluorene and anthracene), P19 (biphenyl containing branched side chains), P21a (tetraalkyl substituted indenofluorene polymer), P23 (polyfluorene bithiophene alternative copolymer), P24 (alternative copolymer of octyl-bisubstituted fluorene and benzothiadiazde), and binary or ternary random copolymer of fluorene and thiophene (Th), ethylenedioxythiophene (EDT), 4.7-dithiophene-2,1,3-benzothiadiazde (DBT), 4.7-dithiophene-2,1,3-benzoselenadiazole (BTSe).

The red light quantum dots 402 and the green light quantum dots 403 are Group II-VI element compounds and Group III-V element compounds. Group II-VI element compounds are compound semiconductor materials formed of Group II element Zn, Cd, or Hg and Group VI element S, Se, or Te. The Group II-VI element compounds are represented by formula A(II)B(VI), that is, ZnS, ZnSe, ZnTe, CdS, CdSe, CdTe, HgS, HgSe, and HgTe. Group III-V element compounds are compounds formed of B, Al, Ga, or In of Group III and N, P, As, or Sb of Group V. The Group III-V element compounds are represented by formula A(III)B(V), such as BN, BP, BAs, BSb, AlN, AlP, AlAs, AlSb, GaN, GaP, GaAs, GaSb, InAs, InN, InP, InSb, and the like.

In the examples of the present disclosure, the electron transferring layer 5 formed on the white light emitting layer 4 may employ a material such as Alq3 and the like.

In examples of the present disclosure, the cathode 6 formed on the electron transferring layer 5 may employ a material such as Ca/Al and the like.

In the light emitting device provided by examples of the present disclosure, the white light emitting layer comprises a polyfluorene blue light material, which has high thermal stability and chemical stability, and also has a high fluorescent quantum yield and a high luminous efficiency, and the polyfluorene blue light material is doped with red light quantum dots and green light quantum dots. The white light emitting layer is a single film layer structure, which can be formed into a film in one time, without preparing a red light emitting layer, a green light emitting layer and a blue light emitting layer, respectively. Therefore, the process is simple, the structure is simple, and it is easy to be scaled up.

In the white light emitting layer 4 in some examples of the present disclosure, the doping ratio of the red light quantum dots 402, green light quantum dots 403, and polyfluorene blue light material 401 are controllable. The desired color gamut of white light can be adjusted by controlling the doping ratio of the red light quantum dots 402, the green light quantum dots 403, and the polyfluorene blue light material 401. In examples of the present disclosure, the doping ratio of the red light quantum dots 402, the green light quantum dots 403 and the polyfluorene blue light material 401 is preferably (0.5-0.8):1:(1.1-1.4).

More preferably, in examples of the present disclosure, the doping ratio of the red light quantum dots 402, the green light quantum dots 403 and the polyfluorene blue light material 401 is (0.6-0.7):1:(1.2-1.3), to improve the color gamut of white light.

Figure 2:
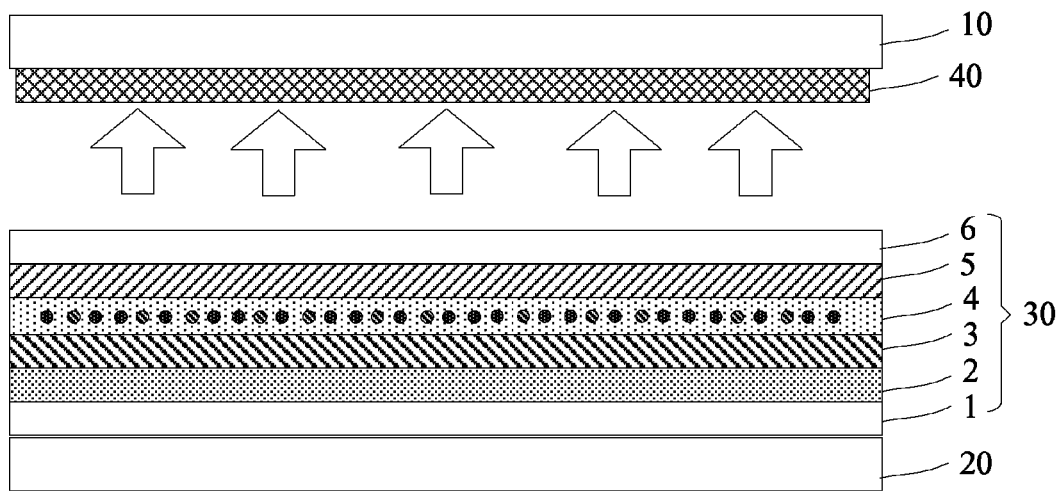
FIG. 2 is a schematic cross-section structure of the display panel provided by an example of the present invention.

On the basis of the same conception, some examples of the present disclosure provide a display panel, as shown in FIG. 2. The display panel comprises a color film substrate 10 and an array substrate 20. The array substrate 20 has a plurality of pixel units (not indicated in the Figure) provided thereon, and each pixel unit has a plurality of subpixel units displaying different colors.

In some examples of the present disclosure, a light emitting device 30 is provided on the array substrate 20 at the positions corresponding to each subpixel unit. The light emitting device 30 is the light emitting device described in the above examples, and comprises a substrate 1, an anode 2, a hole injection layer 3, a white light emitting layer 4, an electron transferring layer 5, and a cathode 6, wherein the white light emitting layer 4, which may emit white light upon excitation, comprises a polyfluorene blue light material 401, and red light quantum dots 402 and green light quantum dots 403 doped into the polyfluorene blue light material 401.

In some examples of the present disclosure, the display panel is provided with a color filter 40 corresponding to each subpixel unit, between the white light emitting layer 4 of the light emitting device 30 and the color film substrate, to achieve full color display.

It should be noted that, in the display panel of an example of the present disclosure as shown in FIG. 2, the color filter 40 is on the side of the color film substrate 10 facing to the array substrate 20, but such position is not limitative. The color filter 40 may also on the side of the array substrate 20 facing to the color film substrate 10.

In the display panel provided by some examples of the present disclosure, the white light emitting layer of the light emitting device comprises a polyfluorene blue light material, which has high thermal stability and chemical stability, and has high fluorescent quantum yield and high luminous efficiency, and moreover, the white light emitting layer has red light quantum dots and green light quantum dots doped into the polyfluorene blue light material. The white light emitting layer is a single film layer structure, which can be formed into a film in one time, without preparing a red light emitting layer, a green light emitting layer, and a blue light emitting layer, respectively. Therefore, the process is simple, the structure is simple, and it is easy to be scaled up. Therefore, the display panel provided by examples of the present disclosure has advantages such as simple production process, good color reproduction property, high repeatability, low cost and the like. If it is combined with the well-established color filter film technology, full color display can be achieved.

Figure 3:
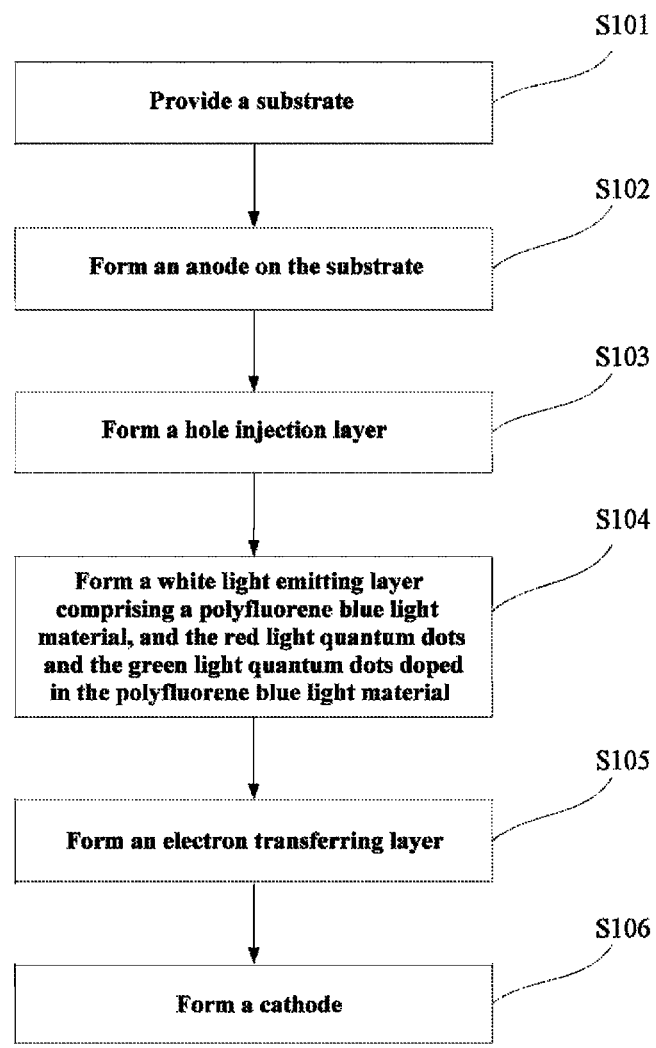
FIG. 3 is a flow chart of the production method of the light emitting device provided by an example of the present invention.

Some examples of the present disclosure further provide a production method of light emitting device, as shown in FIG. 3, comprising:

S101: Provide a substrate.

Specifically, the material of the substrate in some examples of the present disclosure may be a transparent material such as glass, quartz or the like, and may also be an opaque material such as a ceramic or semiconductor material, and may also be a flexible material such as plastic and the like.

S102: Form an anode on the substrate.

Specifically, in some examples of the present disclosure, the anode can be formed on the substrate in a manner such as depositing. The anode in examples of the present disclosure may be preferably selected to be ITO transparent anode made of Indium Tin Oxide (ITO) material.

S103: Form a hole injection layer.

Specifically, in some examples of the present disclosure, PEDOT:PSS hole injection layer may be formed on the ITO anode in a manner of spin coating, vapor depositing, and the like.

S104: Form a white light emitting layer on the hole injection layer.

Specifically, in some examples of the present disclosure, a polyfluorene or derivative thereof, together with red light quantum dots, and green light quantum dot at a predetermined ratio are dissolved into an organic solvent, to form a polyfluorene blue light material doped with the red light quantum dots and the green light quantum dots, and then the polyfluorene blue light material doped with the red light quantum dots and the green light quantum dots is spin coated onto the hole injection layer, to form a white light emitting layer comprising the polyfluorene blue light material, and the red light quantum dots and the green light quantum dots doped into the polyfluorene blue light material.

In some examples of the present disclosure, the manner of forming a white light emitting layer on the hole injection layer is not limited to spin coating, and other manners such as sputtering and the like may also be employed.

In some examples of the present disclosure, the red light quantum dots, the green light quantum dots and the polyfluorene or derivative thereof may be dissolved into an organic solvent together at a doping ratio of (0.5-0.8):1:(1.1-1.4), to form the polyfluorene blue light material doped with the red light quantum dots and the green light quantum dots, so as to control the color gamut of white light in an effective range.

In some examples of the present disclosure, the red light quantum dots, the green light quantum dots, and the polyfluorene or derivative thereof are preferably dissolved into an organic solvent together at a doping ratio of (0.6-0.7):1:(1.2-1.3), to form the polyfluorene blue light material doped with the red light quantum dots and the green light quantum dots, so as to improve the color gamut of white light.

Further, the organic solvent involved above in some examples of the present disclosure may be toluene, chlorobenzene, trichloromethane, or the like, and preferably toluene, to improve the yield of the polyfluorene blue light material doped with the red light quantum dots and the green light quantum dots.

S105: Form an electron transferring layer.

Specifically, in some examples of the present disclosure, Alq3 may be vapor deposited onto the white light emitting layer in a manner of vapor depositing, to form the electron transferring layer on the white light emitting layer.

S106: Form a cathode.

Specifically, in some examples of the present disclosure, on the basis of the above steps, a Ca/Al mixed electrode can be formed as a cathode in a manner such as vapor depositing.

In the light emitting device production method provided by some examples of the present disclosure, a white light emitting layer comprising a polyfluorene blue light material and red light quantum dots and blue light quantum dots doped into the polyfluorene blue light material is formed. Because the polyfluorene blue light material has a high thermal stability and chemical stability, and has a high fluorescent quantum yield, the luminous efficiency is high, and the white light emitting layer is a single film layer structure, which can be formed into a film in one time, without preparing a red light emitting layer, a green light emitting layer, and a blue light emitting layer, respectively. Therefore, the process is simple, the structure is simple, and it is easy to be scaled up.

Obviously, a person skilled in the art can make various modifications and alternatives without departing from the sprit and scope of the present disclosure. In this way, if such modifications and alternatives of the present disclosure belong to the scope of claims and the equivalent techniques of the present disclosure, the present disclosure intents to include such modifications and alternatives.

The invention claimed is:

1. A light emitting device comprising a white light emitting layer, said white light emitting layer comprising:
   a polyfluorene blue light material, and
   red light quantum dots and green light quantum dots doped in the polyfluorene blue light material;
   wherein the polyfluorene blue light material is one or more selected from the group consisting of biphenyl containing branched side chains, a tetraalkyl substituted indenofluorene polymer, a polyfluorene bithiophene alternative copolymer, an alternative copolymer of octyl-bisubstituted fluorene and benzothiadiazde, a binary or ternary random copolymer of fluorene and thiophene, 4.7-dithiophene-2,1,3-benzothiadiazde and 4.7-dithiophene-2,1,3-benzoselenadiazole, or the polyfluorene blue light material consists of ethylenedioxythiophene.

2. The light emitting device according to claim 1, wherein the doping ratio between the red light quantum dots and green light quantum dots is from 0.5:1 to 0.8:1.

3. The light emitting device according to claim 2, wherein the doping ratio between the red light quantum dots and green light quantum dots is from 0.6:1 to 0.7:1.

4. The light emitting device according to claim 1, wherein the doping ratio between the green light quantum dots and polyfluorene blue light material is from 1:1.1 to 1:1.4.

5. The light emitting device according to claim 4, wherein the doping ratio between the green light quantum dots and the polyfluorene blue light material is from 1:1.2 to 1:1.3.

6. The light emitting device according to claim 1, wherein the red light quantum dots are Group II-VI element compounds.

7. The light emitting device according to claim 6, wherein the red light quantum dots are compound semiconductor materials formed of Group II element Zn, Cd, or Hg and Group VI element S, Se, or Te.

8. The light emitting device according to claim 7, wherein the red light quantum dots are ZnS, ZnSe, ZnTe, CdS, CdSe, CdTe, HgS, HgSe, or HgTe.

9. The light emitting device according to claim 1, wherein the green light quantum dots are Group III-V element compounds.

10. The light emitting device according to claim 9, wherein the green light quantum dots are compounds formed of B, Al, Ga, or In of Group III and N, P, As, or Sb of Group V.

11. The light emitting device according to claim 10, wherein the green light quantum dots are BN, BP, BAs, BSb, AN, AlP, AlAs, AlSb, GaN, GaP, GaAs, GaSb, InAs, InN, InP, or InSb.

12. A display panel comprising:
   a color film substrate and an array substrate, wherein the array substrate is provided with a plurality of pixel units, and each pixel unit has a plurality of subpixel units displaying different colors, and wherein the array substrate is provided with the light emitting device according to claim 1 at a position corresponding to each subpixel unit; and a color filter corresponding to each subpixel unit, wherein the color filter is positioned between the white light emitting layer of the light emitting device and the color film substrate.

13. A production method of a light emitting device, comprising:
   forming an anode and a hole injection layer in this order on a substrate;
   forming a white light emitting layer on the hole injection layer, the white light emitting layer comprising a polyfluorene blue light material, and red light quantum dots and green light quantum dots doped into the polyfluorene blue light material; and
   forming an electron transferring layer and a cathode in this order on the white light emitting layer;
   wherein the polyfluorene blue light material is one or more selected from the group consisting of biphenyl containing branched side chains, a tetraalkyl substituted indenofluorene polymer, a polyfluorene bithiophene alternative copolymer, an alternative copolymer of octyl-bisubstituted fluorene and benzothiadiazde, a binary or ternary random copolymer of fluorene and thiophene, 4.7-dithiophene-2,1,3-benzothiadiazde and 4.7-dithiophene-2,1,3-benzoselenadiazole, or the polyfluorene blue light material consists of ethylenedioxythiophene.

14. The method according to claim 13, wherein the white light emitting layer is formed on the hole injection layer by:
   dissolving a polyfluorene or derivative thereof, red light quantum dots and green light quantum dots together into an organic solvent, to form the polyfluorene blue light material doped with red light quantum dots and green light quantum dots; and
   coating the polyfluorene blue light material doped with the red light quantum dots and the green light quantum dots onto the hole injection layer, to form the white light emitting layer.

15. The method according to claim 14, wherein the doping ratio between the red light quantum dots and the green light quantum dots is from 0.5:1 to 0.8:1.

16. The method according to claim 15, wherein the doping ratio between the red light quantum dots and the green light quantum dots is from 0.6:1 to 0.7:1.

17. The method according to claim 14, wherein the doping ratio between the green light quantum dots and the polyfluorene or derivative thereof is from 1:1.2 to 1:1.3.

18. The method according to claim 14, wherein the organic solvent comprises toluene, chlorobenzene or trichloromethane.

19. The method according to claim 14, wherein the doping ratio between the green light quantum dots and the polyfluorene or derivative thereof is from 1:1.1 to 1:1.4.

* * * * *

UNITED STATES PATENT AND TRADEMARK OFFICE
CERTIFICATE OF CORRECTION

PATENT NO. : 9,716,230 B2
APPLICATION NO. : 14/436949
DATED : July 25, 2017
INVENTOR(S) : Chen Tang and Jingxia Gu It is certified that error appears in the above-identified patent and that said Letters Patent is hereby corrected as shown below:

In the Specification

Column 2, Line 26:
Delete "benz othiadiazde"
Insert -- benzothiadiazde --

Column 8, Line 58:
Delete "AN"
Insert -- A1N --

Signed and Sealed this
Third Day of April, 2018

Andrei Iancu
*Director of the United States Patent and Trademark Office*